(12) United States Patent
Kawai et al.

(10) Patent No.: US 10,917,095 B2
(45) Date of Patent: Feb. 9, 2021

(54) LEVEL SHIFTING CIRCUIT AND INTEGRATED CIRCUIT

(71) Applicant: SOCIONEXT INC., Yokohama (JP)

(72) Inventors: Shigeaki Kawai, Yokohama (JP); Atsushi Matsuda, Yokohama (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 16/689,825

(22) Filed: Nov. 20, 2019

(65) Prior Publication Data
US 2020/0091912 A1 Mar. 19, 2020

Related U.S. Application Data

(63) Continuation of application No. PCT/JP2017/018990, filed on May 22, 2017.

(51) Int. Cl.
*H03K 19/0185* (2006.01)
*H03K 3/356* (2006.01)

(52) U.S. Cl.
CPC ............ *H03K 19/018521* (2013.01); *H03K 3/356113* (2013.01)

(58) Field of Classification Search
CPC .............. H03K 3/356113; H03K 19/018521
See application file for complete search history.

(56) References Cited

U.S. PATENT DOCUMENTS 5,483,176 A * 1/1996 Rodriguez ......... H03K 19/0013
326/21
5,541,546 A 7/1996 Okumura
5,808,480 A * 9/1998 Morris ........... H03K 19/018521
326/81
6,320,438 B1 11/2001 Arcus
6,388,498 B1 * 5/2002 Moriwaki ............ H01L 27/092
257/E27.062

(Continued)

FOREIGN PATENT DOCUMENTS

JP 3-232318 A 10/1991
JP 7-231254 A 8/1995

(Continued)

OTHER PUBLICATIONS

International Search Report of related International Patent Application No. PCT/JP2017/018990, dated Aug. 15, 2017.

*Primary Examiner* — Kurtis R Bahr
(74) *Attorney, Agent, or Firm* — Arent Fox LLP

(57) ABSTRACT

A level shifting circuit includes a first inverter, a second inverter, and a third inverter which are connected in a cascade. The first inverter operates at a first power supply voltage supplied to a first power supply line, and the third inverter operates at a second power supply supplied to a second power supply line. The second inverter includes a first p-type transistor having a source connected to the first power supply line, a second p-type transistor having a source connected to the second power supply line, and a first n-type transistor having a source connected to a ground line. Each gate of the first and second p-type transistors and the first n-type transistor is connected to an output terminal of the first inverter, and each drain of the first and second p-type transistors and the first n-type transistor is connected to an input terminal of the third inverter.

8 Claims, 5 Drawing Sheets

(56) References Cited

U.S. PATENT DOCUMENTS

| | | | | |
|---|---|---|---|---|
| 8,373,486 B2* | 2/2013 | Ficke | ............... | H03K 4/94 |
| | | | | 327/333 |
| 8,659,319 B2* | 2/2014 | Hollis | ............... | G11C 7/1057 |
| | | | | 326/86 |
| 2005/0184759 A1 | 8/2005 | Tsukada | | |
| 2010/0052763 A1 | 3/2010 | Chaba et al. | | |
| 2011/0181339 A1 | 7/2011 | Kikuchi | | |
| 2016/0372453 A1* | 12/2016 | Suzuki | ............... | H01L 27/027 |
| 2018/0358969 A1* | 12/2018 | Davies | ............... | H03K 19/018521 |

FOREIGN PATENT DOCUMENTS

| | | |
|---|---|---|
| JP | 2000-357958 A | 12/2000 |
| JP | 2004-215172 A | 7/2004 |
| JP | 2005-236668 A | 9/2005 |
| JP | 2009-81679 A | 4/2009 |
| JP | 2011-151719 A | 8/2011 |
| JP | 2012-502558 A | 1/2012 |

\* cited by examiner

VDD12=(VDD1+VDD2)/2

| VDD1 [V] | VDD2 [V] | Vt [V] | Vth2 [V] | (VDD1+VDD2)/4 [V] |
|---|---|---|---|---|
| 0.8 | 1.0 | 0.2 | 0.46 | 0.45 |
| 1.0 | 0.8 | 0.2 | 0.46 | 0.45 |
| 1.0 | 1.5 | 0.3 | 0.67 | 0.625 |

US 10,917,095 B2

LEVEL SHIFTING CIRCUIT AND INTEGRATED CIRCUIT

CROSS-REFERENCE TO RELATED APPLICATION

This application is a continuation of International Application PCT/JP2017/018990 filed on May 22, 2017 and designated the U.S., the entire contents of which are incorporated herein by reference.

FIELD

The present invention relates to a level shifting circuit and an integrated circuit.

BACKGROUND

Conventionally, there is known a level shifting circuit employing a latch, which shifts a signal level between circuits operating at different power supply voltages (see Patent Document 1, for example).

However, in the latch-based level shifting circuit, it takes time before a signal changes between low-level and high-level and the latch is up. Thus, a pulse width of a signal may change before and after the signal is level-shifted. If the pulse width of the signal changes before and after the level shift, contents of the signal may be incorrectly transmitted.

RELATED-ART DOCUMENTS

Patent Documents

[Patent Document 1] Japanese National Publication of International Patent Application No. 2012-502558

SUMMARY

In one aspect of the present disclosure, there is provision of a level shifting circuit including: a first inverter configured to perform an operation at a first power supply voltage supplied to a first power supply line, the operation of the first inverter including outputting a first signal to a first node, the first signal being obtained by inverting an input signal; a second inverter configured to output a second signal to a second node, the second signal being obtained by inverting the first signal received from the first node; and a third inverter configured to perform an operation at a second power supply voltage supplied to a second power supply line, the second power supply voltage being different from the first power supply voltage, the operation of the third inverter including outputting an output signal obtained by inverting the second signal received from the second node. The second inverter includes a first p-type transistor, a second p-type transistor, and a first n-type transistor. A source of the first p-type transistor is connected to the first power supply line, a source of the second p-type transistor is connected to the second power supply line, and a source of the first n-type transistor is connected to a ground line. Each gate of the first p-type transistor, the second p-type transistor, and the first n-type transistor is connected to the first node, and each drain of the first p-type transistor, the second p-type transistor, and the first n-type transistor is connected to the second node.

DETAILED DESCRIPTION OF THE PREFERRED EMBODIMENTS

Hereinafter, embodiments according to the present disclosure will be described with reference to the drawings.

Figure 1:
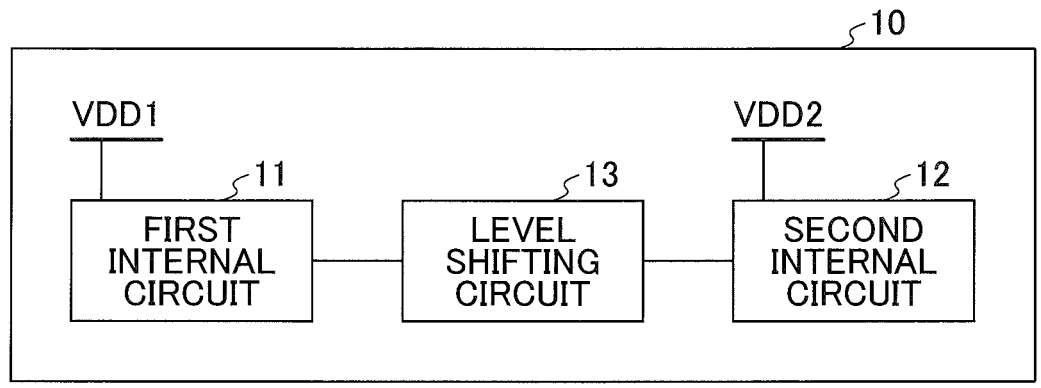
FIG. 1 illustrates an example of an integrated circuit configuration according to the present disclosure.

FIG. 1 is a diagram illustrating an example of an integrated circuit configuration according to the present disclosure. An integrated circuit 10 illustrated in FIG. 1 includes a level shifting circuit 13 for passing a signal between circuits operating at different power supply voltages. The integrated circuit 10 is an example of a semiconductor integrated circuit, and includes a first internal circuit 11, the level shifting circuit 13, and a second internal circuit 12.

The first internal circuit 11 operates at a power supply voltage VDD1, which is an example of a first power supply voltage. The power supply voltage VDD1 is an example of voltage supplied to a first power supply line. The second internal circuit 12 operates at a power supply voltage VDD2, which is an example of a second power supply voltage. The power supply voltage VDD2 is an example of voltage supplied to a second power supply line. The power supply voltage VDD2 is different from the power supply voltage VDD1.

The level shifting circuit 13 shifts a signal level (also referred to as an "amplitude") of a signal between the first internal circuit 11 and the second internal circuit 12. The level shifting circuit 13 shifts a signal level of a signal input from the first internal circuit 11, and outputs the level shifted signal to the second internal circuit 12. The level shifting circuit 13 according to the present disclosure can be applied in a case in which the power supply voltage VDD2 is higher than the power supply voltage VDD1 and in a case in which the power supply voltage VDD2 is lower than the power supply voltage VDD1.

Figure 2:
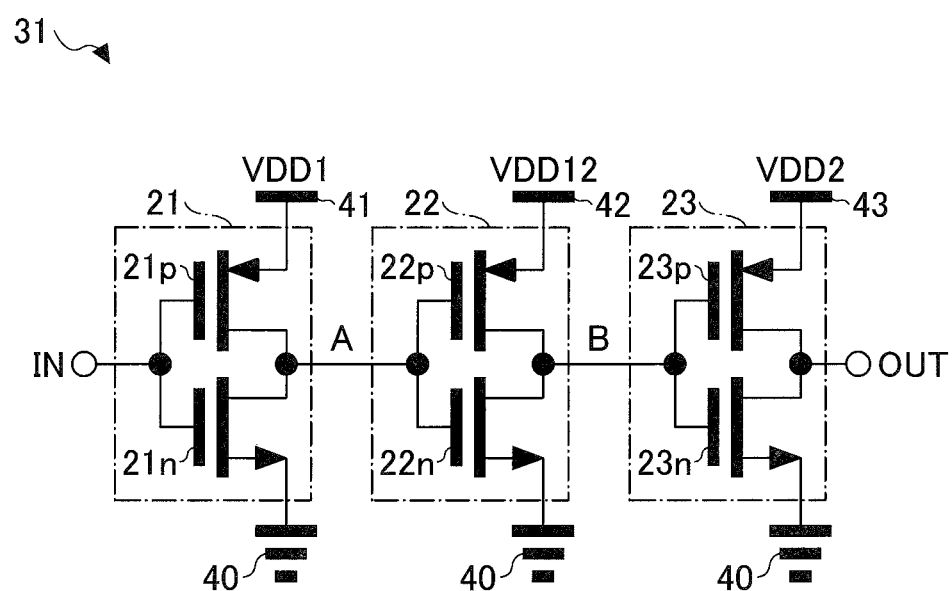
FIG. 2 is a diagram illustrating a first configuration example of a level shifting circuit according to the present disclosure.

FIG. 2 is a diagram illustrating a first example of a configuration of a level shifting circuit according to the present disclosure. A level shifting circuit 31 illustrated in FIG. 2 is an example of the level shifting circuit 13 in FIG. 1. The level shifting circuit 31 includes an odd number (three in this example) of inverters 21, 22, and 23 connected in a cascade. The inverters 21, 22, and 23 are CMOS type inverters, each of which is formed by connecting a PMOS transistor and an NMOS transistor in series. CMOS means Complementary MOS (Metal Oxide Semiconductor). P in PMOS represents p-type (p-channel type), and N in NMOS represents n-type (n-channel type).

The inverter 21 is an example of a first inverter, and operates at the power supply voltage VDD1, which is voltage supplied to a power supply line 41. The power supply line 41 is an example of the first power supply line.

The power supply voltage VDD1 is voltage between the power supply line 41 and a ground line 40.

The inverter 21 outputs a signal (referred to as a "signal Sa"), which is obtained by inverting a signal level of a signal (referred to as an "input signal Sin") input from an input terminal IN, to an intermediate node A. The signal Sa is an example of a first signal. The intermediate node A is an example of a first node. The first internal circuit 11 is connected to the input terminal IN. The input signal Sin transmitted from the first internal circuit 11 is input to a common gate of the inverter 21 via the input terminal IN.

The inverter 21 includes a p-type transistor 21p whose source is connected to the power supply line 41, and an n-type transistor 21n whose source is connected to the ground line 40. Each gate of the p-type transistor 21p and the n-type transistor 21n is connected to an input terminal IN, and each drain of the p-type transistor 21p and the n-type transistor 21n is connected to the intermediate node A.

The inverter 23 is an example of a third inverter and operates at the power supply voltage VDD2, which is voltage supplied to the power supply line 43. The power supply line 43 is an example of a second power supply line. The power supply voltage VDD2 is voltage between the power supply line 43 and the ground line 40.

The inverter 23 outputs a signal (referred to as an "output signal Sout"), which is obtained by inverting a signal level of a signal (referred to as a "signal Sb") input from an intermediate node B, to an output terminal OUT. The signal Sb is an example of a second signal. The intermediate node B is an example of a second node. The second internal circuit 12 is connected to the output terminal OUT. The output signal Sout, which is output from a common drain of the inverter 23 via the output terminal OUT, is input to the second internal circuit 12.

The inverter 23 includes a p-type transistor 23p whose source is connected to the power supply line 43, and an n-type transistor 23n whose source is connected to the ground line 40. Each gate of the p-type transistor 23p and the n-type transistor 23n is connected to the intermediate node B, and each drain of the p-type transistor 23p and the n-type transistor 23n is connected to the output terminal OUT.

The inverter 22 is an example of a second inverter, and operates at a power supply voltage VDD12, which is voltage supplied to the power supply line 42. The power supply line 42 is an example of a third power supply line connected to a supply source of the power supply voltage VDD12. The power supply voltage VDD12 is a potential difference between the power supply line 42 and the ground line 40. The power supply voltage VDD12 is an example of an intermediate voltage that is between the power supply voltage VDD1 and the power supply voltage VDD2. In the present embodiment, the power supply voltage VDD12 is equal to an average voltage (=(VDD1+VDD2)/2) between the power supply voltage VDD1 and the power supply voltage VDD2.

The inverter 22 outputs the signal Sb, which is obtained by inverting a level of the signal Sa input from the intermediate node A, to the intermediate node B.

The inverter 22 includes a p-type transistor 22p whose source is connected to the power supply line 42, and an n-type transistor 22n whose source is connected to the ground line 40. Each gate of the p-type transistor 22p and the n-type transistor 22n is connected to the intermediate node A, and each drain of the p-type transistor 22p and the n-type transistor 22n is connected to the intermediate node B.

The level shifting circuit 31 includes a voltage generating circuit for generating the power supply voltage VDD12. The voltage generating circuit generates the power supply voltage VDD12 such that a pulse width of the input signal Sin input from the input terminal IN becomes equal to a pulse width of the output signal Sout output from the output terminal OUT. Note that, in the present embodiment, a pulse width of a signal means, for example, a length (time period) of a waveform in the signal representing one logical state of information. For example, with respect to a waveform in a signal representing the logical state of "1" (may also be referred to as "high-level" or "H"), a voltage level of the waveform is above a threshold voltage of an inverter, and a pulse width of the signal corresponds to a length (time period) of the waveform having a voltage level above the threshold voltage of the inverter.

Figure 3:
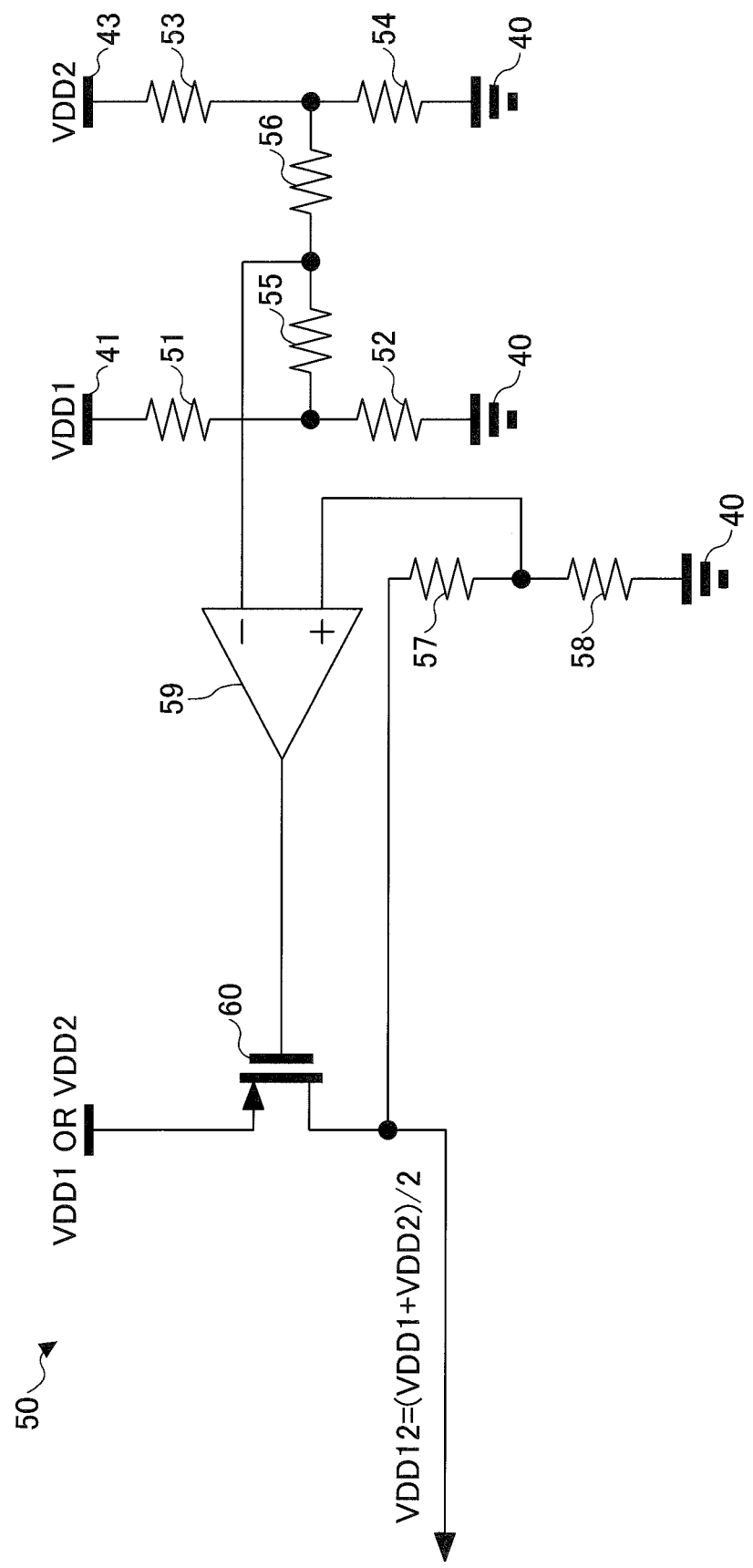
FIG. 3 is a diagram illustrating an example of a configuration of a voltage generating circuit.

FIG. 3 is a diagram illustrating an example of the voltage generating circuit for generating the power supply voltage VDD12. A regulator 50 illustrated in FIG. 3 is an example of the voltage generating circuit that generates the power supply voltage VDD12. The regulator 50 adjusts the power supply voltage VDD12 such that the power supply voltage VDD12 becomes the average voltage between the power supply voltage VDD1 and the power supply voltage VDD2. The regulator 50 includes resistors 51 to 58, an operational amplifier (op-amp) 59, and a p-type transistor 60.

A reference voltage generating circuit configured by the resistors 51 to 56 generates a predetermined reference voltage based on the power supply voltage VDD1 and the power supply voltage VDD2, and supplies the generated reference voltage to an inverting input node of the op-amp 59. The p-type transistor 60 is a MOS transistor having a gate connected to an output node of the op-amp 59, a source connected to the power supply line 41 or the power supply line 43, and a drain connected to the ground line 40 via the resistors 57 and 58. The source of the p-type transistor 60 is connected to the power supply line to which the higher voltage is supplied, from among the power supply line 41 and the power supply line 43. An intermediate connecting point, at which the resistors 57 and 58 are connected, is connected to a non-inverting input node of the op-amp 59. A feedback voltage generating circuit configured by the resistors 57 and 58 generates a feedback voltage at the intermediate connection point between the resistor 57 and the resistor 58, and provides the generated feedback voltage to the non-inverting input node of the op-amp 59. The op-amp 59 functions as a control voltage generating circuit that provides a control voltage to the gate of the p-type transistor 60 based on the supplied reference voltage and the supplied feedback voltages. The regulator 50 having such a configuration can output the power supply voltage VDD12 (=(VDD1+VDD2)/2) from the drain of the p-type transistor 60, by adjusting each resistance of the resistors 51-58.

In the level shifting circuit 31 illustrated in FIG. 2, a threshold voltage of each of the inverters is designed to be half that of the power supply voltage. When the inverters are designed in such a manner, a difference between a threshold voltage of the inverter 21 at a first stage and a threshold voltage of the inverter 22 at a second stage is equal to a difference between the threshold voltage of the inverter 22 at the second stage and a threshold voltage of the inverter 23 at a third stage.

For example, with respect to the inverter 21 at the first stage, let V1 be a voltage of the input signal Sin. In this case, drain current in a saturation region of each of the transistors in the inverter 21 is expressed by the following expressions:

$$Id(\text{PMOS}) = \beta p \times (VDD1 - V1 - Vthp)^2$$

$$Id(\text{NMOS}) = \beta n \times (V1 - Vthn)^2$$

In the above expressions, Id(PMOS) represents drain current of the p-type transistor, and Id(NMOS) represents drain current of the n-type transistor. Vthp represents a threshold voltage of the p-type transistor, and Vthn represents a threshold voltage of the n-type transistor. βp and βn represent gain of the p-type transistor and gain of the n-type transistor respectively. βp and βn are respectively expressed by the following expressions:

$$\beta p = 1/2 \times (Wp \times \mu p \times Cox/Lp)$$

$$\beta n = 1/2 \times (Wn \times \mu n \times Cox/Ln)$$

In the above expressions, Wp, μp, Cox, and Lp respectively represent a gate width, hole mobility, gate capacitance, and a gate length, of the p-type transistor. Wn, μn, Cox, and Ln respectively represent a gate width, electron mobility, gate capacitance, and a gate length, of the n-type transistor. A transistor ratio of each of the transistors is designed such that the threshold voltage Vthp of the p-type transistor is approximately equal to the threshold voltage Vthn of the n-type transistor, and that βp is approximately equal to βn. Because the threshold voltage Vth of the inverter 21 is the input voltage V1 when Id(PMOS)=Id(NMOS), the following equation is satisfied.

$$VDD1 - V1 = V1$$

From the above equation, the following expression can be obtained.

$$V1 = VDD1/2$$

That is, the threshold voltage Vth1 of the inverter 21 can be obtained by calculating Vth1=VDD1/2. Similarly, the threshold voltage Vth2 of the inverter 22 at the second stage can be obtained by Vth2=VDD12/2, and the threshold voltage Vth3 of the inverter 23 at the third stage can be obtained by Vth3=VDD2/2.

Accordingly, in the case of the level shifting circuit 31 of FIG. 2, the difference between the threshold voltage of the inverter 21 at the first stage and the threshold voltage of the inverter 22 at the second stage becomes equal to the difference between the threshold voltage of the inverter 22 at the second stage and the threshold voltage of the inverter 23 at the third stage.

Figure 4:
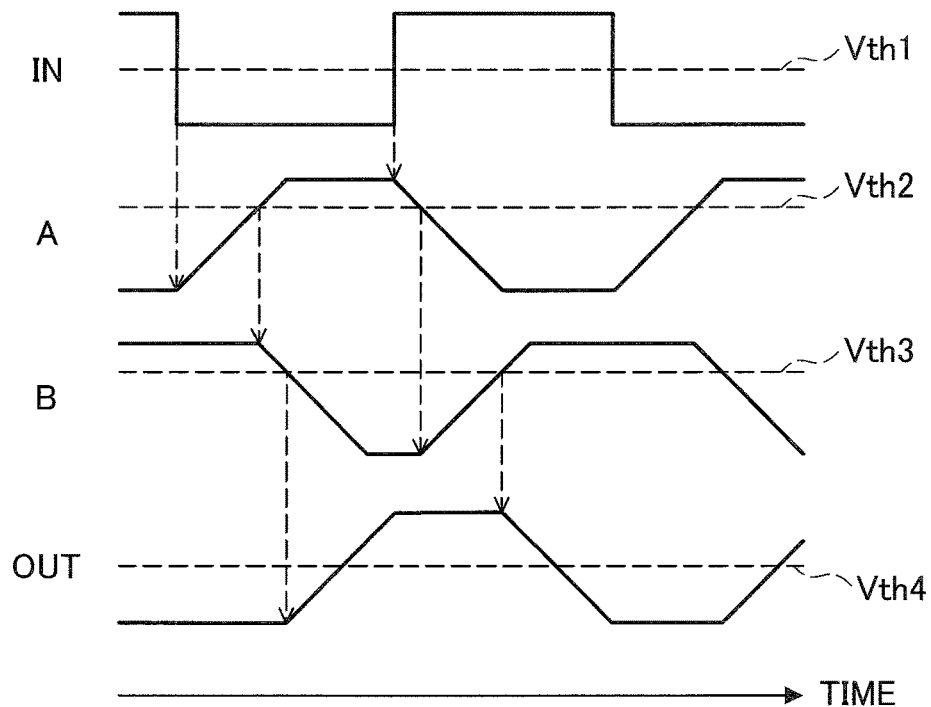
FIG. 4 is a diagram illustrating an example of operation waveforms at each terminal and at each node.

Therefore, even when magnitude of the threshold voltage of each of the inverters differs, for example, when magnitude of the threshold voltages Vth1, Vth2, and Vth3 is in the order of Vth1<Vth2<Vth3, an amount of change of a pulse width of a signal caused by a signal level shifting from a signal level at the first stage to a signal level at the second stage (i.e. a difference between a pulse width of a signal output from the inverter 21 and a pulse width of a signal output from the inverter 22) becomes equal to an amount of change of a pulse width of a signal caused by a signal level shifting from a signal level at the second stage to a signal level at the third stage (i.e. a difference between a pulse width of a signal output from the inverter 22 and a pulse width of a signal output from the inverter 23). Because the signal input from the inverter 22 to the inverter 23 is inverted at the inverter 23, both of the differences are cancelled through inversion of signals. Therefore, a length of time (pulse width) in which the output signal Sout (output from the inverter 23 at the third stage) is in high-level is the same as a length of time (pulse width) in which the input signal Sin (input to the inverter 21) is in low-level, and the output signal Sout whose signal level is shifted from VDD1 to VDD2 can be obtained, as illustrated in FIG. 4. Accordingly, contents of the input signal Sin can be correctly transmitted to a later-stage circuit with respect to the inverter 23. Note that Vth4 represents a threshold voltage of the circuit disposed at the stage after the inverter 23.

Figure 5:
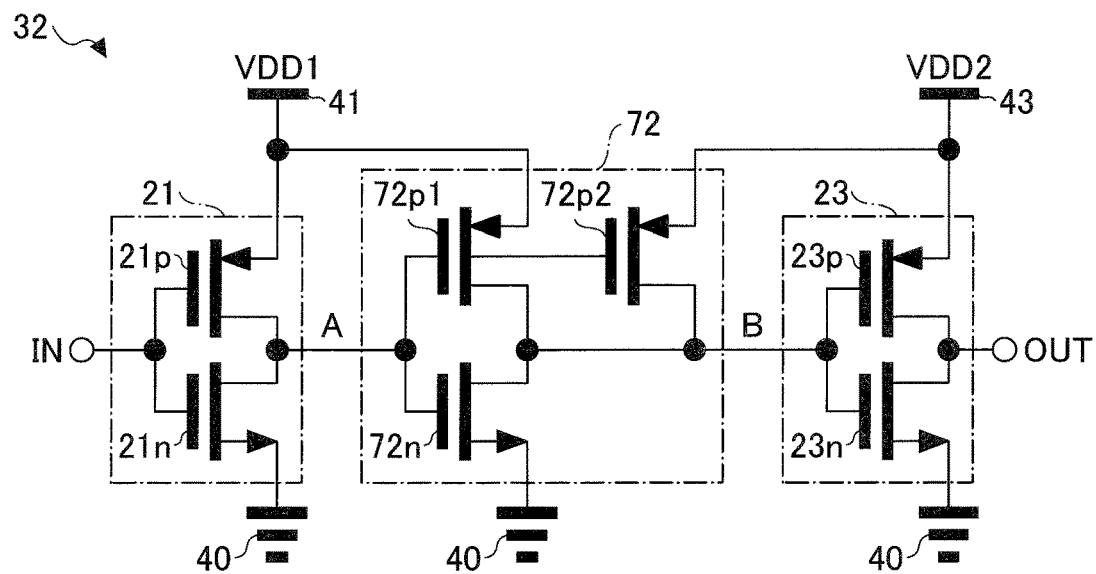
FIG. 5 illustrates a second configuration example of the level shifting circuit according to the present disclosure.

FIG. 5 is a diagram illustrating a second example of the level shifting circuit according to the present disclosure. A level shifting circuit 32 illustrated in FIG. 5 is an example of the level shifting circuit 13 of FIG. 1. The level shifting circuit 32 includes an odd number (in this example, three) of inverters 21, 72, and 23 connected in cascade. The inverters 21, 72, and 23 are CMOS type inverters, each of which is formed by connecting a PMOS transistor and an NMOS transistor in series. In the second example, description of configuration which is the same as that of the above-described example is omitted or simplified by incorporating the above-described description.

The inverter 72 outputs a signal Sb, which is obtained by inverting a level of the signal Sa input from the intermediate node A, to the intermediate node B.

The inverter 72 includes a p-type transistor 72p1 whose source is connected to the power supply line 41, a p-type transistor 72p2 whose source is connected to the power supply line 43, and an n-type transistor 72n whose source is connected to the ground line 40. Each gate of the p-type transistor 72p1, the p-type transistor 72p2, and the n-type transistor 72n is connected to the intermediate node A. Each drain of the p-type transistor 72p1, the p-type transistor 72p2, and the n-type transistor 72n is connected to the intermediate node B.

In the case of the level shifting circuit 32 of FIG. 5, a gate width of the p-type transistor 21p is defined to be X times a gate width of the n-type transistor 21n (where X is a positive value), and a gate width of the p-type transistor 23p is defined to be X times a gate width of the n-type transistor 23n. Also, gate widths of the p-type transistor 72p1 and the p-type transistor 72p2 are formed to be (X/2) times a gate width of the n-type transistor 72n. By forming each of the transistors as described above, a difference between the threshold voltage of the inverter 21 at the first stage and the threshold voltage of the inverter 72 at the second stage is substantially equal to a difference between the threshold voltage of the inverter 72 at the second stage and the threshold voltage of the inverter 23 at the third stage.

For example, let V2 be a voltage of the signal Sa. In this case, with respect to the inverter 72 at the second stage, drain current in a saturation region of the transistors is expressed by the following expressions:

$$Id(PMOS) = (\beta p/2) \times \{(VDD1 - V2 - Vtp)^2 + (VDD2 - V2 - Vtp)^2\}$$

$$Id(NMOS) = \beta n \times (V2 - Vtn)^2$$

In the above expressions, Id(NMOS) represents drain current of the n-type transistor. βn represents gain of the n-type transistor. Vtn represents a threshold voltage of the n-type transistor. Id(PMOS) represents an amount of drain current of the p-type transistor 72p1 and the p-type transistor 72p2, (βp/2) represents gain of the p-type transistor 72p1 and the p-type transistor 72p2, and Vtp represents a threshold voltage of the p-type transistor 72p1 and the p-type transistor 72p2. A transistor ratio is designed such that the threshold voltage Vtp of each of the p-type transistors is approximately equal to the threshold voltage Vtn of the n-type transistor (Vtp=Vtn=Vt), and that βp is approximately equal to βn (βp=βn). Because a threshold voltage Vth2 of the inverter 72 is the input voltage V2 when Id(PMOS)=Id(NMOS), the following equation is satisfied.

$$Vth2 = \{(VDD1)^2 + (VDD2)^2 - 2 \times VDD1 \times Vt - 2 \times VDD2 \times Vt\}/(2 \times VDD1 + 2 \times VDD2 - 8 \times Vt)$$

Figures 6, 7:
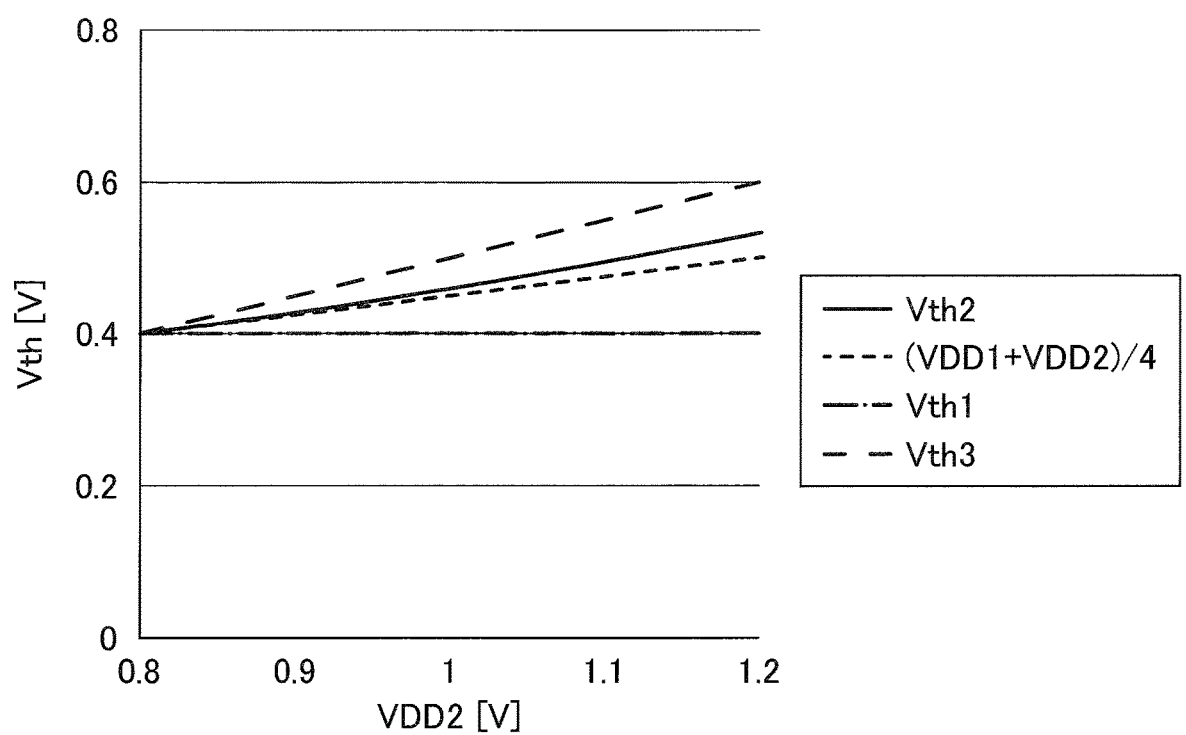
FIG. 6 is a diagram illustrating a specific example of a threshold voltage.
FIG. 7 is a diagram illustrating a change in Vth2 when VDD1 is fixed and VDD2 is changed.

If voltages in three specific cases are substituted into this equation, a result illustrated in FIG. 6 is obtained. As can be seen from FIG. 6, the threshold voltage Vth2 of the inverter 72 at the second stage becomes close to an average value (VDD1+VDD2)/4 of the threshold voltage Vth1 (=VDD1/2) of the inverter 21 at the first stage and the threshold voltage Vth3 (=VDD2/2) of the inverter 23 at the third stage, regardless of magnitude relationship between VDD1 and VDD2.

Accordingly, in the case of the level shifting circuit 32 of FIG. 5, the difference between the threshold voltage of the inverter 21 at the first stage and the threshold voltage of the inverter 72 at the second stage is substantially equal to the difference between the threshold voltage of the inverter 72 at the second stage and the threshold voltage of the inverter 23 at the third stage.

Therefore, even when magnitude of the threshold voltage of each of the inverters differs, for example, when magnitude of the threshold voltages Vth1, Vth2, and Vth3 is in the order of Vth1<Vth2<Vth3, an amount of change of a pulse width of a signal caused by a shifting of a signal level from a signal level at the first stage to a signal level at the second stage, and an amount of change of a pulse width of a signal caused by a shifting of a signal level from a signal level at the second stage to a signal level at the third stage, become equal. Because the signal input from the inverter 72 to the inverter 23 is inverted at the inverter 23, both of the amounts of change are cancelled through inversion of signals. Therefore, a length of time (pulse width) in which the output signal Sout (output from the inverter 23 at the third stage) is in high-level is the same as a length of time (pulse width) in which the input signal Sin (input to the inverter 21) is in low-level, and the output signal Sout whose signal level is shifted from VDD1 to VDD2 can be obtained, as illustrated in FIG. 4. Accordingly, contents of the input signal Sin can be correctly transmitted to a later-stage circuit with respect to the inverter 23. Note that Vth4 represents a threshold voltage of the circuit disposed at the stage after the inverter 23.

FIG. 7 illustrates a change in Vth2 in a case in which VDD1 is fixed at 0.8 V and VDD2 is changed. Note that Vt is fixed to 0.2 V. As illustrated in FIG. 7, Vth2 is approximately in the middle area between Vth1 and Vth3, and a difference from an ideal value (VDD1+VDD2)/4 is small. If magnitude of VDD1 and VDD2 is fixed, by adjusting βp and βn, for example, by adjusting the size ratio of the transistors, only in the second stage (inverter 72), Vth2 can be made to be approximately equal to (VDD1+VDD2)/4.

Accordingly, in the case of the level shifting circuit 32 of FIG. 5, the difference between the threshold voltage of the inverter 21 at the first stage and the threshold voltage of the inverter 72 at the second stage is substantially equal to the difference between the threshold voltage of the inverter 72 at the second stage and the threshold voltage of the inverter 23 at the third stage.

Figure 8:
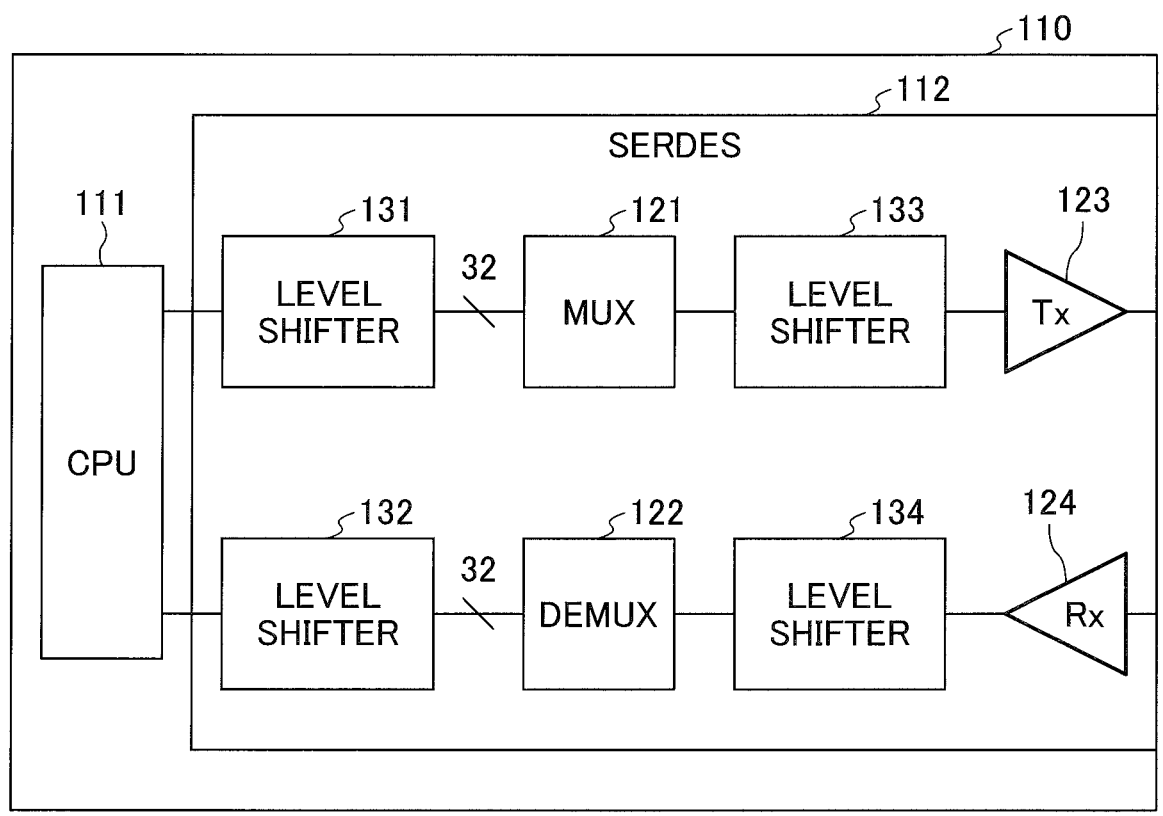
FIG. 8 illustrates a specific example of an integrated circuit equipped with a level shifting circuit.

FIG. 8 illustrates a specific example of an integrated circuit equipped with a level shifting circuit. An integrated circuit 110 includes a CPU (Central Processing Unit) 111. The integrated circuit 110 also includes a SERDES (SERializer/DESerializer) 112. The CPU is an example of a processor. The SERDES is an example of a circuit that converts serial data and parallel data mutually.

A level shifter 131 transmits a signal between the CPU 111 and a multiplexer (MUX) 121 which are circuitry each operating at a different power supply voltage. A level shifter 132 transmits a signal between a demultiplexer (DEMUX) 122 and the CPU 111 which are circuitry each operating at a different power supply voltage. Because the CPU 111 consumes large electrical energy, a technique for optimizing power consumption of the CPU 111 is used by adjusting a voltage supplied to the CPU 111 in accordance with process variation and an operating state. In contrast, a voltage supplied to the SERDES 112 is fixed to achieve high speed operation. In this case, a relationship of larger vs. smaller magnitude between a voltage supplied to the CPU 111 and a voltage supplied to the SERDES 112 may be reversed. By applying the level shifting circuit according to the present embodiment to the level shifters 131 and 132, it is possible to suppress a change in a pulse width of a signal before vs. after a level shifting even between circuits operating at different power supply voltages.

A level shifter 133 transmits a signal between the multiplexer (MUX) 121 and a transmitting circuit (Tx) 123 which are circuitry each operating at a different power supply voltage. A level shifter 134 transmits a signal between a receiving circuit (Rx) 124 and the demultiplexer (DEMUX) 122 which are circuitry each operating at a different power supply voltage. A voltage supplied to the SERDES 112 is set to be high to achieve high speed operation. The transmitting circuit (Tx) 123 requires a high voltage to output a desired voltage, but if a voltage supplied to the entire circuitry of the SERDES 112 is increased, power consumption increases. Accordingly, to only a circuit in the SERDES 112 that requires a high power supply voltage, a high voltage is supplied. In this case, the level shifters 133 and 134 are required such that a rise time and a fall time are short and that a change in a pulse width is also small, in order to achieve high speed operation. Accordingly, by applying the level shifting circuit according to the present embodiment to the level shifters 133 and 134, it is possible to suppress a change in pulse width of a signal before vs. after a level shifting even between circuits operating at different power supply voltages.

Although the level shifting circuit and the integrated circuit have been described by way of embodiment, the present invention is not limited to the above described embodiments. Various modifications and enhancements, such as combinations and substitutions with some or all of other embodiments, may be made within the scope of the present invention.

What is claimed is:

1. A level shifting circuit comprising:
   a first inverter configured to operate at a first power supply voltage supplied to a first power supply line and configured to output a first signal to a first node, the first signal being obtained by inverting an input signal;
   a second inverter configured to output a second signal to a second node, the second signal being obtained by inverting the first signal received from the first node; and
   a third inverter configured to operate at a second power supply voltage supplied to a second power supply line and configured to output an output signal obtained by inverting the second signal received from the second node, the second power supply voltage being different from the first power supply voltage; wherein
   the second inverter includes a first p-type transistor, a second p-type transistor, and a first n-type transistor;
   a source of the first p-type transistor is connected to the first power supply line;
   a source of the second p-type transistor is connected to the second power supply line;
   a source of the first n-type transistor is connected to a ground line;

each gate of the first p-type transistor, the second p-type transistor, and the first n-type transistor is connected to the first node; and each drain of the first p-type transistor, the second p-type transistor, and the first n-type transistor is connected to the second node.

2. The level shifting circuit according to claim 1, wherein the first inverter includes a third p-type transistor having a source connected to the first power supply line, and a second n-type transistor having a source connected to the ground line, a gate width of the third p-type transistor being X times a gate width of the second n-type transistor (where X is a positive value);

the third inverter includes a fourth p-type transistor having a source connected to the second power supply line, and a third n-type transistor having a source connected to the ground line, a gate width of the fourth p-type transistor being X times a gate width of the third n-type transistor; and each gate width of the first p-type transistor and the second p-type transistor is (X/2) times a gate width of the first n-type transistor.

3. An integrated circuit comprising:

a first internal circuit configured to operate at a first power supply voltage supplied to a first power supply line;

a second internal circuit configured to operate at a second power supply voltage supplied to a second power supply line, the second power supply voltage being different from the first power supply voltage; and a level shifting circuit configured to perform a signal level shifting of a signal between the first internal circuit and the second internal circuit, the level shifting circuit including a first inverter configured to operate at the first power supply voltage, and configured to output a first signal to a first node, the first signal being obtained by inverting a signal input from the first internal circuit;

a second inverter configured to output a second signal to a second node, the second signal being obtained by inverting the first signal received from the first node; and a third inverter configured to operate at the second power supply voltage and configured to output, to the second internal circuit, a signal obtained by inverting the second signal received from the second node; wherein the second inverter includes a first p-type transistor, a second p-type transistor, and a first n-type transistor;

a source of the first p-type transistor is connected to the first power supply line;

a source of the second p-type transistor is connected to the second power supply line;

a source of the first n-type transistor is connected to a ground line;

each gate of the first p-type transistor, the second p-type transistor, and the first n-type transistor is connected to the first node; and each drain of the first p-type transistor, the second p-type transistor, and the first n-type transistor is connected to the second node.

4. A level shifting circuit comprising:

a first inverter configured to operate at a first power supply voltage supplied to a first power supply line and configured to output a first signal to a first node, the first signal being obtained by inverting an input signal;

a second inverter configured to output a second signal to a second node, the second signal being obtained by inverting the first signal received from the first node;

a third inverter configured to operate at a second power supply voltage supplied to a second power supply line and configured to output an output signal obtained by inverting the second signal received from the second node, the second power supply voltage being different from the first power supply voltage; and a voltage generating circuit configured to generate an intermediate voltage having magnitude between the first power supply voltage and the second power supply voltage, such that a length of time in which the output signal is in high-level becomes a same as a length of time in which the input signal is in low-level;

wherein the second inverter is configured to operate at the intermediate voltage; and wherein the voltage generating circuit includes:

a transistor provided between a third power supply line to which the intermediate voltage is supplied, and one power supply line from among the first power supply line and the second power supply line, a voltage supplied to the one power supply line being higher than a voltage supplied to another power supply line from among the first power supply line and the second power supply line;

a reference voltage generating circuit configured to generate a reference voltage, based on the first power supply voltage and the second power supply voltage;

a feedback voltage generating circuit configured to generate a feedback voltage based on the intermediate voltage; and a control voltage generating circuit configured to receive the reference voltage via a first input node, to receive the feedback voltage via a second input node, and to generate a control voltage for the transistor based on the reference voltage and the feedback voltage.

5. The level shifting circuit according to claim 4, wherein the magnitude of the intermediate voltage is an average of the first power supply voltage and the second power supply voltage.

6. A level shifting circuit comprising:

a first inverter configured to operate at a first power supply voltage supplied to a first power supply line and configured to output a first signal to a first node, the first signal being obtained by inverting an input signal;

a second inverter configured to output a second signal to a second node, the second signal being obtained by inverting the first signal received from the first node;

a third inverter configured to operate at a second power supply voltage supplied to a second power supply line and configured to output an output signal obtained by inverting the second signal received from the second node, the second power supply voltage being different from the first power supply voltage; and a voltage generating circuit configured to generate an intermediate voltage having magnitude between the first power supply voltage and the second power supply voltage, such that a length of time in which the output signal is in high-level becomes a same as a length of time in which the input signal is in low-level;

wherein the second inverter is configured to operate at the intermediate voltage;

the first inverter includes a first p-type transistor having a source connected to the first power supply line, and a first n-type transistor having a source connected to a ground line;

the second inverter includes a second p-type transistor having a source connected to the voltage generating circuit, and a second n-type transistor having a source connected to the ground line; and the third inverter includes a third p-type transistor having a source connected to the second power supply line, and a third n-type transistor having a source connected to the ground line.

7. An integrated circuit comprising:

a first internal circuit configured to operate at the first power supply voltage;

a second internal circuit configured to operate at the second power supply voltage; and the level shifting circuit according to claim 4 provided between the first internal circuit and the second internal circuit, the level shifting circuit being configured to receive the input signal from the first internal circuit, and to output the output signal to the second internal circuit; wherein the level shifting circuit is configured to shift a signal level between the first internal circuit and the second internal circuit.

8. An integrated circuit comprising:

a first internal circuit configured to operate at a first power supply voltage;

a second internal circuit configured to operate at a second power supply voltage; and a level shifting circuit provided between the first internal circuit and the second internal circuit, the level shifting circuit being configured to receive an input signal from the first internal circuit, and to output an output signal to the second internal circuit by shifting a signal level between the first internal circuit and the second internal circuit, the level shifting circuit including:

a first inverter configured to operate at a first power supply voltage supplied to a first power supply line and configured to output a first signal to a first node, the first signal being obtained by inverting an input signal;

a second inverter configured to output a second signal to a second node, the second signal being obtained by inverting the first signal received from the first node;

a third inverter configured to operate at a second power supply voltage supplied to a second power supply line and configured to output an output signal obtained by inverting the second signal received from the second node, the second power supply voltage being different from the first power supply voltage; and a voltage generating circuit configured to generate an intermediate voltage having magnitude between the first power supply voltage and the second power supply voltage, such that a length of time in which the output signal is in high-level becomes a same as a length of time in which the input signal is in low-level; wherein the second inverter is configured to operate at the intermediate voltage;

the first inverter includes a first p-type transistor having a source connected to the first power supply line, and a first n-type transistor having a source connected to a ground line;

the second inverter includes a second p-type transistor having a source connected to the voltage generating circuit, and a second n-type transistor having a source connected to the ground line; and the third inverter includes a third p-type transistor having a source connected to the second power supply line, and a third n-type transistor having a source connected to the ground line.

\* \* \* \* \*